(12) United States Patent
Uchiyama et al.

(10) Patent No.: US 7,473,922 B2
(45) Date of Patent: Jan. 6, 2009

(54) INFRARED DETECTOR

(75) Inventors: Yasuhito Uchiyama, Kawasaki (JP); Toshio Fujii, Kawasaki (JP); Nobuyuki Kajihara, Kawasaki (JP); Hironori Nishino, Kawasaki (JP); Yusuke Matsukura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/447,014

(22) Filed: Jun. 6, 2006

(65) Prior Publication Data
US 2007/0131923 A1 Jun. 14, 2007

(30) Foreign Application Priority Data
Dec. 9, 2005 (JP) ............... 2005-356272
Mar. 13, 2006 (JP) ............... 2006-068172

(51) Int. Cl.
*H01L 29/06* (2006.01)
(52) U.S. Cl. ............... 257/14; 977/932; 977/774; 257/21; 257/E29.071; 438/48
(58) Field of Classification Search ............ 257/14–25, 257/E29.071; 977/774, 932; 438/48, 590
See application file for complete search history.

(56) References Cited

U.S. PATENT DOCUMENTS
2005/0077539 A1* 4/2005 Lipson ............... 257/186

FOREIGN PATENT DOCUMENTS
JP 2006-186183 A * 7/2006

OTHER PUBLICATIONS

Zhengmao Ye et al.: "InAs quantum dot infrared photodetectors with $In_{0.15}Ga_{0.85}As$ strain-relief cap layers," *Journal of Applied Physics*, vol. 92, No. 12; Dec. 15, 2002; pp. 7462-7468.

* cited by examiner

*Primary Examiner*—Evan Pert
*Assistant Examiner*—Scott R Wilson
(74) *Attorney, Agent, or Firm*—Kratz, Quintos & Hanson, LLP

(57) ABSTRACT

At least one or more dark current reducing layers having a quantum well structure are provided at an end portion in a stacking direction of an infrared detecting section in which quantum dot layers are stacked.

15 Claims, 15 Drawing Sheets

INFRARED DETECTOR

CROSS-REFERENCE TO RELATED APPLICATIONS

This application is based upon and claims the benefit of priority from the prior Japanese Patent Application Nos. 2006-68172, filed on Mar. 13, 2006, and 2005-356272, filed on Dec. 9, 2005, the entire contents of which are incorporated herein by reference.

BACKGROUND OF THE INVENTION

1. Field of the Invention

The present invention relates to an infrared detector including quantum dot layers, and particularly relates to an infrared detector which realizes a reduction in dark current.

2. Description of the Related Art

In recent years, a quantum dot infrared photo detector (QDIP), which uses a quantum dot structure as an infrared absorbing section has attracted much attention as an infrared detector.

In the quantum dot infrared photo detector, by exciting an electron located at a conduction-band quantum level in an InAs quantum dot sandwiched between i-type GaAs layers by infrared light incident from the outside and catching it as a current, that is, a photocurrent, the infrared light is detected.

Quantum dots composing the QDIP are formed by a self-formation method in a molecular beam epitaxial apparatus, and therefore they are distributed in a plane perpendicular to a growth direction. Note that to increase the efficiency of detecting infrared light, in usual use, layers each including quantum dots are stacked in plural layers, for example, eight layers (See Journal of applied Physics, Vol. 92, No. 12, pp. 7462-7468, 15 Dec. 2002, for example).

FIG. 18 is a conceptual sectional view showing an example of a conventional QDIP. In this example, an n-type GaAs bottom electrode layer 52 is formed on a semi-insulating GaAs substrate 51, and quantum dot layers 53 are stacked approximately in 6 to 20 cycles (layers) on the n-type GaAs bottom electrode layer 52. Each of the quantum dot layers 53 is constituted by embedding plural InAs quantum dots 55 in an i-type GaAs layer 54. Further, an n-type GaAs top electrode layer 56 is formed on the uppermost quantum dot layer 53. Furthermore, electrodes 57 and 58 made of AuGe/Ni/Au are respectively formed on the n-type GaAs bottom electrode layer 52 and the n-type GaAs top electrode layer 56. Such a stacked structure can be obtained if the n-type GaAs bottom electrode layer 52, the quantum dot layers 53 approximately in 6 to 20 cycles, and the n-type GaAs top electrode layer 56 are formed in sequence on the semi-insulating GaAs substrate 51 and thereafter partially etching the n-type GaAs top electrode layer 56 and the quantum dots layers 53 so as to expose the n-type GaAs bottom electrode layer 52.

Next, the operation of the conventional QDIP shown in FIG. 18 will be described.

FIG. 19 is a diagram showing a conduction-band edge profile when no bias is applied to the conventional QDIP shown in FIG. 18. When no bias is applied, no impurity is added to the stack of the quantum dot layers 53, so that electrons are supplied from the n-type GaAs bottom electrode layer 52 and the n-type GaAs top electrode layer 56. However, quantum levels (a ground level 61 and an excited level 62) formed in the InAs quantum dot 55 is located at energy levels lower than a conduction-band edge of GaAS, so that the supplied electrons are relaxed to the quantum levels 61 and 62.

Since Fermi energy $E_f$ is defined to be equal to energy at which the proportion of occupation of electrons in some state reduces to half, in this case, the ground level 61 corresponds to the energy.

When a system is kept in thermal equilibrium, the Fermi energy $E_f$ is fixed in the entire system. Hence, conduction-band edges of the InAs quantum dots 55 rise such that conduction-band edges of the electrode layers 52 and 56, which are at a Fermi energy level, and the ground levels 61 of the InAs quantum dots 55 substantially match each other.

However, in the quantum dot layers 53 located near the n-type GaAs bottom electrode layer 52 and the n-type GaAs top electrode layer 56, excessive electrons are supplied from the electrode layers 52 and 56, so that the Fermi energy reaches the excited level 62. As a result, the rise of the conduction-band is small.

FIG. 20 is a diagram showing a conduction-band edge profile when a bias is applied to the conventional QDIP shown in FIG. 18. Here, it is assumed that an electric field is applied uniformly to the stack of the quantum dot layers 53. When a bias is applied, a difference in potential applied by a power source 59 exists between a pair of electrodes 57 and 58, and hence if infrared light is irradiated from the outside to excite electrons, these electrons flow between the n-type GaAs bottom electrode layer 52 and the n-type GaAs top electrode layer 56. Namely, a photocurrent is generated.

On the other hand, even in a state where the infrared light is not irradiated, due to a difference in potential applied between the n-type GaAs bottom electrode layer 52 and the n-type GaAs top electrode layer 56, an electron 63 located in the low-potential side electrode layer (n-type GaAs bottom electrode layer 52) flows between the electrode layers 52 and 56. Namely, the electron 63 which has flowed from the low-potential side electrode layer (n-type GaAs bottom electrode layer 52) regards a conduction-band edge of the i-type GaAs layer 54 which is several layers away therefrom as the highest barrier, and when the electron 63 goes over the conduction-band edge, a dark current flows. This dark current flows also when the infrared light is irradiated.

Since the performance of the photo detector is mostly dependent on the ratio of a photocurrent to a dark current, it is a requirement to reduce the dark current in order to improve the performance of the detector.

From the above-described mechanism, the higher the barrier, the smaller the dark current becomes, and therefore, heightening the barrier is a means of reducing the dark current. Hence, it is thought that if the barrier is heightened by embedding the InAs quantum dots 55 in a semiconductor layer such as an AlGaAs layer, which has a larger band gap than the i-type GaAs layer 54, in place of the i-type GaAs layer 54, the reduction in dark current becomes possible.

However, although in the growth of quantum dots, a growth temperature of about 500° C. is required, the AlGaAs layer is generally grown at about 600° C. Therefore, in terms of the optimization of the growth condition and so on, it is difficult to use the AlGaAs layer as the layer in which the quantum dots are embedded.

SUMMARY OF THE INVENTION

Hence, an object of the present invention is to provide an infrared detector capable of reducing a dark current by heightening a barrier to electrons which become the dark current while maintaining the growth temperature of a quantum dot embedding layer at a temperature suitable for the growth temperature of quantum dots.

As a result of assiduous study to solve the above problems, the inventors of the present application have reached the invention described below.

An infrared detector according to the present invention is provided with an infrared detecting section which includes stacked plural quantum dot layers and at least one dark current reducing layer which is provided at an end portion in a stacking direction of the infrared detecting section and has a quantum well structure.

Now, the principle of the infrared detector according to the present invention will be described referring to FIG. 1. FIG. 1 is a view showing the principle of the present invention.

The infrared detector according to the present invention can be shown, for example, as in FIG. 1. Namely, an infrared detecting section 1 which includes stacked plural quantum dot layers 2 is provided, and moreover, at least one dark current reducing layer 4 having a quantum well structure is provided at an end portion in a stacking direction of the infrared detecting section 1.

By providing the dark current reducing layer 4 having the quantum well structure instead of an AlGaAs layer or the like as just described, a potential barrier to electrons which become the dark current can be made higher without raising the growth temperature.

Incidentally, an internal electric field is opposite in direction to an electric field applied between electrode layers 7 and 8. Therefore, electrons excited by infrared light in the dark current reducing layer 4, as in the quantum dot layers 2 near the electrode layers 7 and 8, never flow to the high-potential side electrode layer 8 in accordance with a potential difference given between the electrode layers 7 and 8. Accordingly, without exerting any influence upon the photocurrent, the effect of reducing the dark current can be obtained, resulting in an improvement in the performance of the infrared detector.

It is suitable to use a quantum dot layer 5 which includes plural quantum dots 6 having a larger average size than quantum dots 3 composing the infrared detecting section 1, as the dark current reducing layer 4. By making the size of the quantum dot 6 larger than that of the quantum dot 3, not only the spacing between quantum levels becomes narrower but also the quantum levels lower, so that Fermi energy relatively lowers. As a result, conduction-band edges of the quantum dots in the dark current reducing layer 4 rise, and the potential barrier to electrons becomes higher.

Moreover, it is suitable to use a quantum dot layer which includes plural quantum dots having a higher numerical density than that of the quantum dots 3 composing the infrared detecting section 1, as the dark current reducing layer 4. By heightening the numerical density of quantum dots, the number of quantum levels occupied by the electrons supplied from the electrode layers 7 and 8 increases, so that the Fermi energy relatively lowers. As a result, the conduction-band edges of the quantum dots in the dark current reducing layer 4 rise, and the potential barrier to electrons becomes higher.

Further, it is suitable to use a quantum dot layer which includes plural quantum dots having a larger average size and a higher numerical density than those of the quantum dots 3 composing the infrared detecting section 1, as the dark current reducing layer 4. A synergistic effect between size and density can be obtained.

Furthermore, it is also suitable to use a quantum dot layer including a one-dimensional quantum well layer as the dark current reducing layer 4. The Fermi energy in the dark current reducing layer 4 remains maintained at a ground level, so that the conduction-band edges of the quantum dots in the dark current reducing layer 4 rise, and the potential barrier to electrons becomes higher. As a result, the effect of reducing the dark current can be obtained, and besides the manufacturing process is simplified.

Moreover, it is also suitable to use a quantum dot layer which includes plural quantum dots using a material having a smaller band gap than that of the quantum dots 3 composing the infrared detecting section 1 as a quantum well, as the dark current reducing layer 4. In the quantum dot which uses the small-band-gap material as the quantum well, a conduction-band edge of a well portion lowers, and thereby quantum levels formed therein also lower. Accordingly, the Fermi energy also relatively lowers. As a result, conduction-band edges of the dark current reducing layer 4 rise, and the potential barrier to electrons becomes higher.

Incidentally, the dark current reducing layer 4 may be a single layer, and it may have a multilayer structure of two layers or three or more layers, if a rise in conduction-band edge is small in the case of the single layer, for example.

DETAILED DESCRIPTION OF THE PREFERRED EMBODIMENTS

Embodiments of the present invention will be specifically described below with reference to the attached drawings. Note that for convenience, a constitution of an infrared detector will be described with a manufacturing method thereof.

First Embodiment

Figure 1:
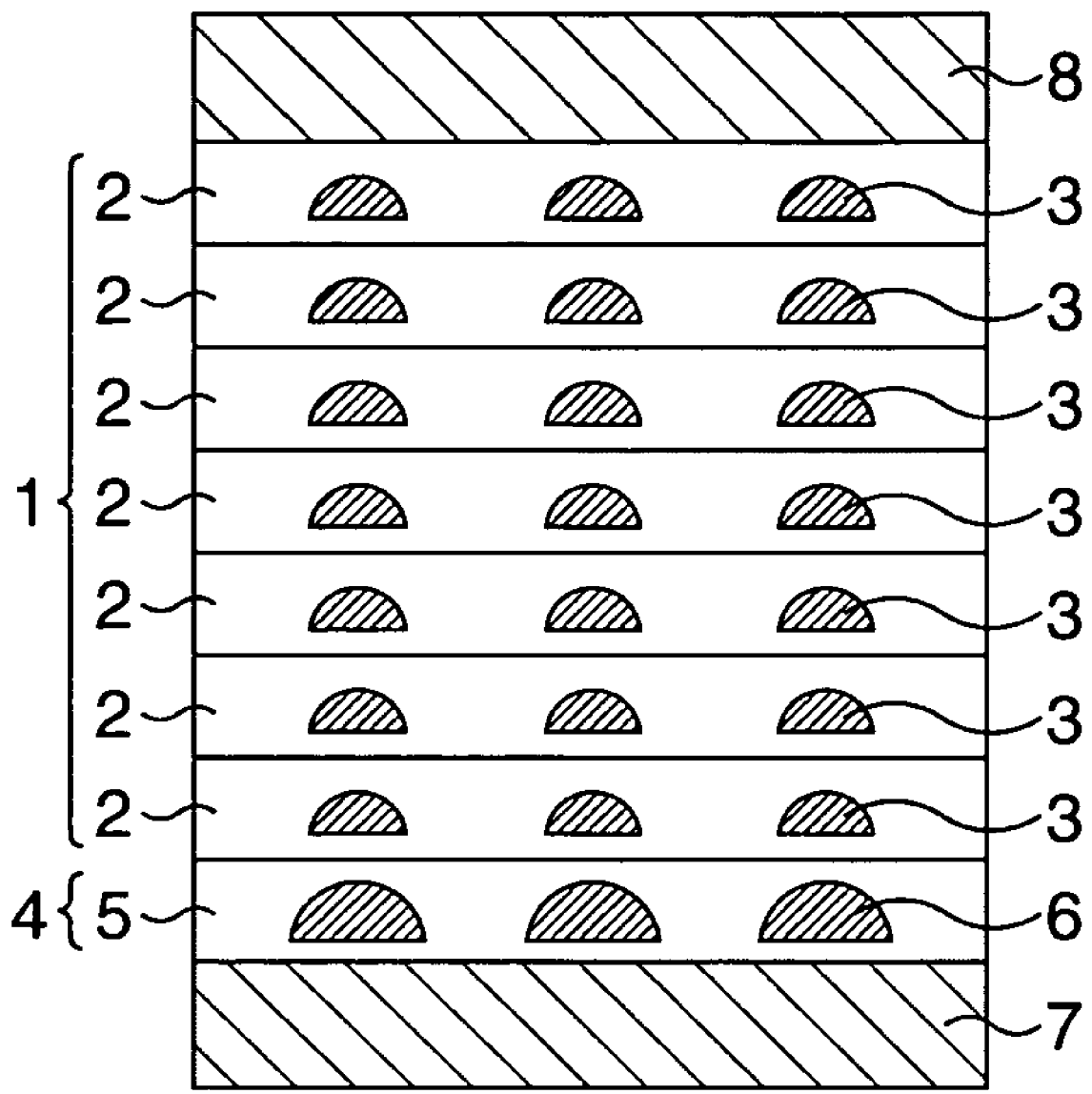
FIG. 1 is a view showing the principle of the present invention.
Figure 2:
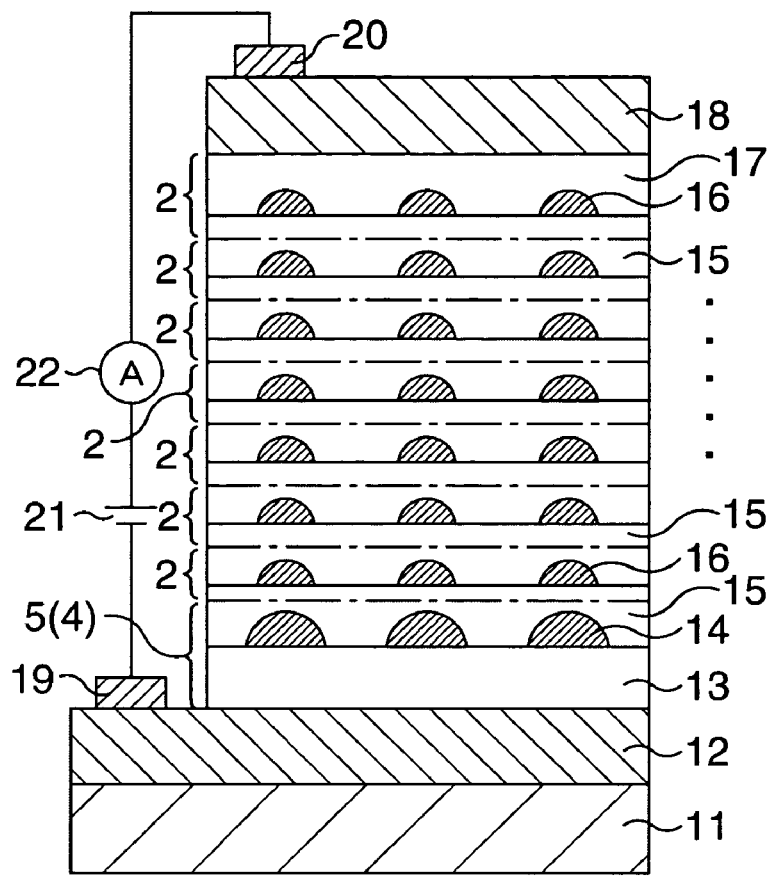
FIG. 2 is a sectional view showing a conceptual constitution of a QDIP according to a first embodiment of the present invention.

First, a first embodiment of the present invention will be described. FIG. 2 is a sectional view showing a conceptual constitution of a QDIP according to the first embodiment of the present invention.

First, an n-type GaAs layer 12, for example, with a thickness of about 1000 nm (=1 μm) and a Si concentration of about $2 \times 10^{18}$ cm$^{-3}$ is grown as a bottom electrode layer on a semi-insulating GaAs substrate 11 at a substrate temperature of, for example, 600° C. by a molecular beam epitaxial method.

Then, an i-type GaAs layer 13 with a thickness of, for example, 50 nm is grown on the n-type GaAs layer 12. Incidentally, the substrate temperature is lowered from 600° C. to a temperature suitable for the formation of quantum dots, for example, 500° C. while the i-type GaAs layer 13 is grown.

Subsequently, while the substrate temperature is maintained at 500° C., InAs is supplied such that the growth rate becomes, for example, 0.2 ML (monolayer)/s (second). When a certain amount of InAs has been supplied, a compressive strain applied to an InAs layer which starts to grow on the i-type GaAs layer 13 increases, the InAs layer three-dimensionally grows, and quantum dots 14 are self-formed.

In the formation of the quantum dots 14, the total supply amount of InAs is set larger than each total supply amount (for example, 2.0 ML) when quantum dots 16 are formed later. For example, here the total supply amount of InAs is set to 2.5 ML. As a result, the size of the quantum dot 14 become larger than the quantum dot 16 formed later. For example, the volume of each of the quantum dots 14 becomes about one and a half times the size of that when the total supply amount is set to 2.0 ML.

Because the quantum dots 14 and 16 are grown on a semiconductor layer and also covered by a growth of semiconductor, as described above, a whole surface of the quantum dots 14 and 16 is in contact with the semiconductor layers both above and below.

Thereafter, while the substrate temperature is maintained at 500° C., an i-type GaAs layer 15 with a thickness of, for example, 50 nm is grown on the i-type GaAs layer 13 so as to cover the quantum dots 14. A first-layer quantum dot layer 5 (dark current reducing layer 4 having a quantum well structure) is composed of the i-type GaAs layer 13, the quantum dots 14, and a part of the i-type GaAs layer 15 covering the quantum dots 14. Then, by supplying InAs such that the growth rate becomes, for example, 0.2 ML/s, the second-layer quantum dots 16 are formed.

In the formation of the quantum dots 16, the total supply amount of InAs is set to about 2.0 ML. As a result, the quantum dot 16 become smaller than the quantum dot 14. Incidentally, the supply amount of about 2.0 ML is about the same as a conventional one, and the size of the quantum dot 16 becomes about the same as that used for a conventional infrared detector.

Subsequently, the formation of the i-type GaAs layer 15 and the formation of the quantum dots 16 are repeated. The second and subsequent layer quantum dot layers 2 are each composed of the quantum dots 16, a part of the i-type GaAs layer 15 immediately below these quantum dots 16, and a part of the i-type GaAs layer 15 covering these quantum dots 16. For example, if the total number of quantum dot layers will be eight, the growth of the i-type GaAs layer 15 and the supply of InAs are later repeated six times.

Thereafter, an i-type GaAs layer 17 with a thickness of, for example, 50 nm is grown so as to cover the quantum dots 16 located uppermost. The quantum dot layer 2 located uppermost is composed of these quantum dots 16, a part of the i-type GaAs layer 15 immediately below these quantum dots 16, and the i-type GaAs layer 17. Incidentally, the substrate temperature is raised from 500° C. to 600° C. again while the i-type GaAs layer 17 is grown.

Then, while the substrate temperature is maintained at 600° C., an n-type GaAs layer 18, for example, with a thickness of about 1000 nm and a Si concentration of about $2 \times 10^{18}$ cm$^{-3}$ is grown as a top electrode layer.

Subsequently, by etching a part of the n-type GaAs layer 18, the i-type GaAs layer 17, and the i-type GaAs layers 15 and the i-type GaAs layer 13 including the quantum dots 16 or 14 with lithography technique and dry etching technique, a part of the surface of the n-type GaAs layer 12 is exposed. Thereafter, using a metal deposition method, electrodes 19 and 20 are formed on the n-type GaAs layer 18 (top electrode layer) and the n-type GaAs layer 12 (bottom electrode layer). The electrodes 19 and 20 are constituted, for example, by stacking a Ni film and a Au film on a AuGe film. Thus, the basic constitution of the QDIP according to the first embodiment is completed.

Figure 3:
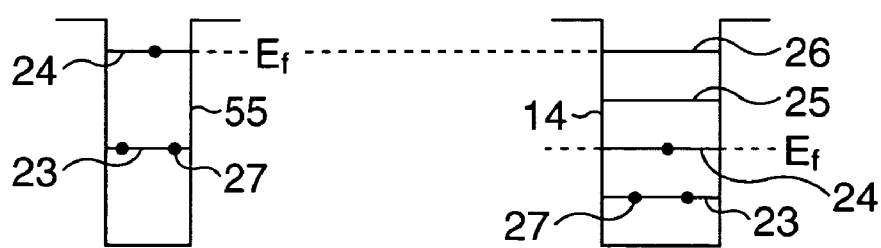
FIG. 3 is a diagram showing the relation between Fermi energy and a quantum dot size.

Now, dependence of Fermi energy on quantum dot size will be described. FIG. 3 is a diagram showing the relation between Fermi energy and a quantum dot size. The left side of FIG. 3 shows energy levels of the quantum dot 55 used in the conventional infrared detector, and the right side thereof shows energy levels of the quantum dot 14. The size of the quantum dot 55 is about the same as that of the quantum dot 16 and smaller than that of the quantum dot 14.

As both are compared, in the small quantum dot 55, quantum levels are only a ground level 23 and a first excited level 24.

In contrast, in the large quantum dot 14, the spacing between quantum levels is narrower than that in the quantum dot 55, and hence many higher excited levels 25 and 26 are formed, so that the energy at the first excited level 24 is lower than that of the quantum dot 55. Therefore, as the same number of electrons 27 are supplied from the electrode layer to the quantum dots 14 and 55, respectively, the Fermi energy of the quantum dot 14 becomes relatively lower than the Fermi energy of the quantum dot 55.

For example, if three electrons are supplied to each quantum dot, the supplied electrons 27 occupy the quantum levels sequentially from the quantum level at which energy is the lowest, so that the first and second electrons 27 are disposed at the ground level 23, and the third electron 27 is disposed at the first excited level 24. As a result, the Fermi energy coincides with the first excited level 24.

Next, the operation of the QDIP according to the first embodiment will be described.

Figure 4:
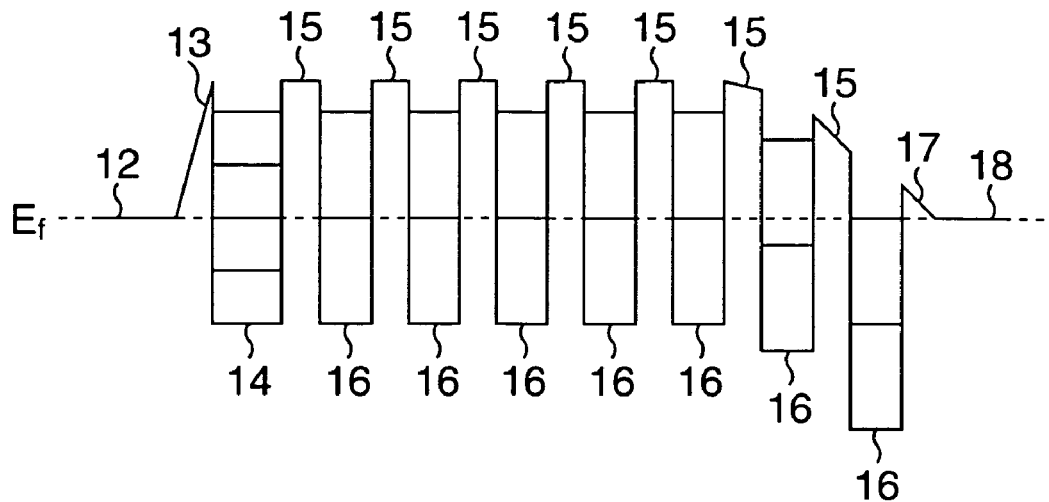
FIG. 4 is a diagram showing a conduction-band edge profile when no bias is applied to the QDIP according to the first embodiment.

FIG. 4 is a diagram showing a conduction-band edge profile when no bias is applied to the QDIP according to the first embodiment. When no bias is applied, electrons are supplied from the n-type GaAs layer 12 and the n-type GaAs layer 18. However, quantum levels (ground levels and excited levels) generated in the quantum dots 14 and 16 are located at energy levels lower than a conduction-band edge of GaAs, so that the supplied electrons are relaxed to the quantum levels.

When a system is kept in thermal equilibrium, Fermi energy $E_f$ is fixed in the entire system. Hence, conduction-band edges of the quantum dots 16 rise such that conduction-band edges of the electrode layers 12 and 18, which are at a Fermi energy level, and the ground levels 23 of the quantum dots 14 and 16 substantially match each other. Furthermore, in the present embodiment, since the Fermi energy of the quantum dot 14 is relatively lower than that of the quantum dot 16, a conduction-band edge of the quantum dot 14 also rises.

Figure 5:
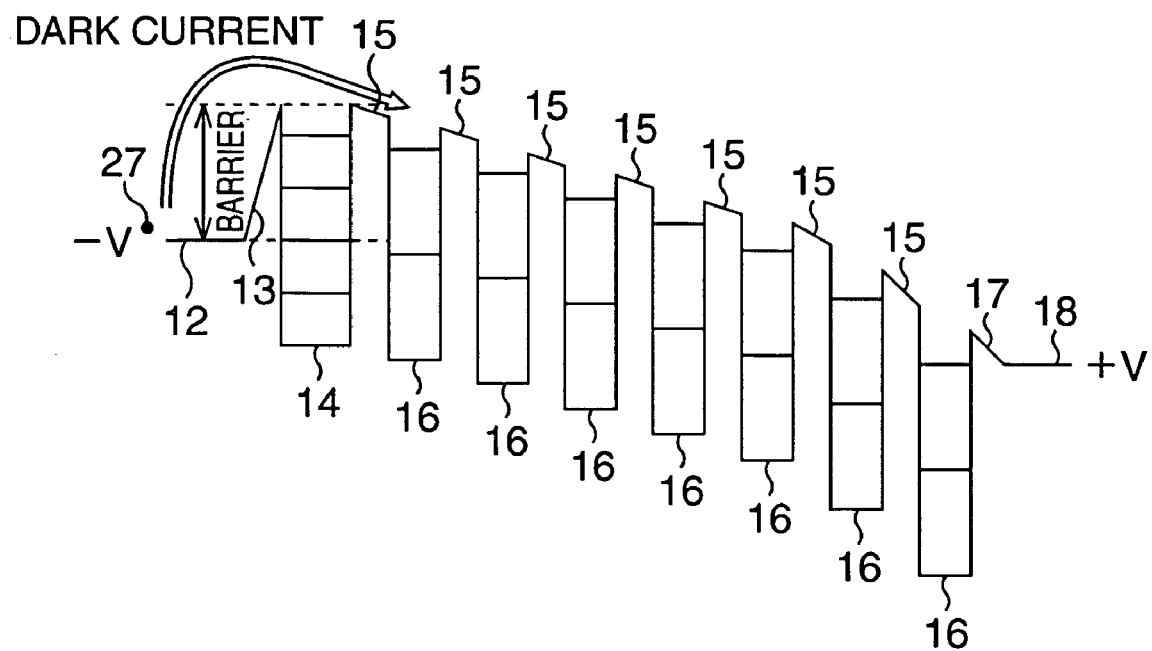
FIG. 5 is a diagram showing a conduction-band edge profile when a bias is applied to the QDIP according to the first embodiment.

FIG. 5 is a diagram showing a conduction-band edge profile when a bias is applied to the QDIP according to the first embodiment. When a bias is applied, a potential difference applied by a power source 21 exists between the n-type GaAs layer 12 and the n-type GaAs layer 18. Therefore, as infrared light is irradiated from the outside to excite electrons, these electrons flow between the n-type GaAs layer 12 and the n-type GaAs layer 18. Namely, a photocurrent is produced.

Figure 20:
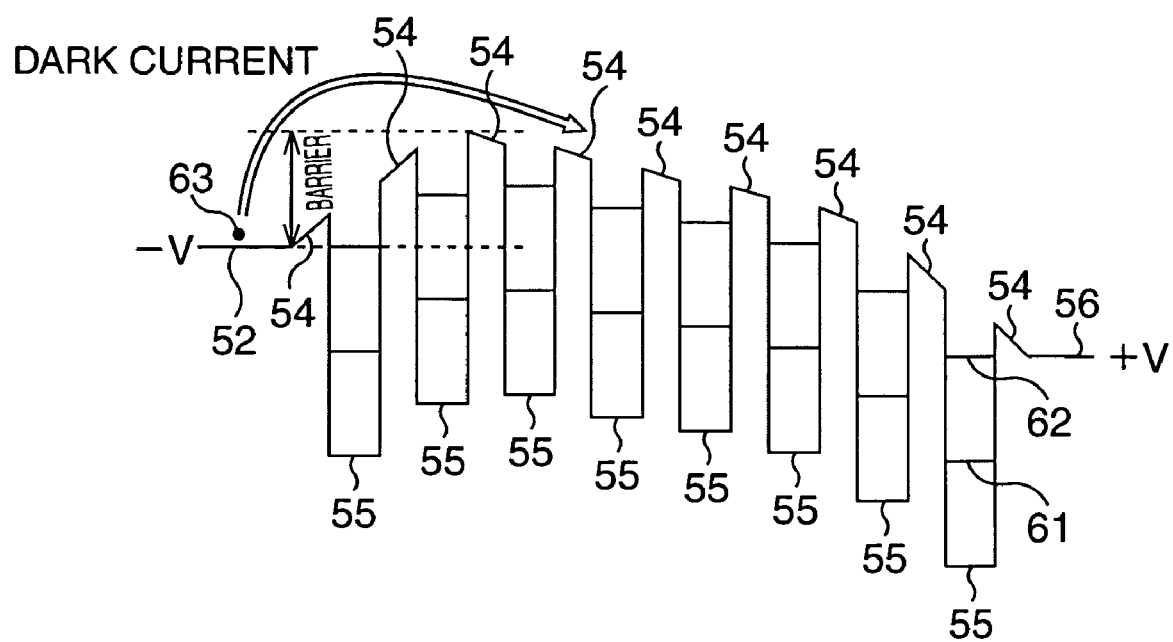
FIG. 20 is a diagram showing a conduction-band edge profile when a bias is applied to the QDIP shown in FIG. 18.

On the other hand, even in a state where the infrared light is not irradiated, due to the difference in potential applied between the n-type GaAs layer 12 and the n-type GaAs layer 18, the electron 27 located in the n-type GaAs layer 12 tries to flow between the electrode layers 12 and 18. However, a barrier to the electron located in the n-type GaAs layer 12 is a barrier formed by the quantum dot 14, and it is located spatially closer as compared with a barrier when no large quantum dot 14 is provided, for example, the conventional one shown in FIG. 20, and accompanying this the barrier becomes higher. As a result, the dark current becomes smaller.

Accordingly, if the current flowing between the electrode layers 12 and 18 in this state is measured by an ammeter 22, a change in current when the infrared light enters is detected in a state where the dark current gets less than the conventional one. Namely, the high-performance infrared detector can be obtained.

As described above, in the first embodiment, the quantum dot layer 5 (dark current reducing layer 4) including the quantum dots 14 each being larger than the quantum dot 16 exists between the stack of the quantum dot layers 2 each including the quantum dots 16 (infrared detecting section 1) and the bottom electrode layer (n-type GaAs layer 12). Therefore, it is possible to, without using AlGaAs or the like, which needs high-temperature growth, as a quantum dot embedding layer, make an effective potential barrier to electrons higher to thereby reduce the dark current.

Incidentally, an internal electric field is opposite in direction to an electric field applied between the electrode layers 12 and 18. Therefore, even if electrons are excited by infrared light in the quantum dot layer 5 (dark current reducing layer 4) including the quantum dots 14, these electrons never flow to the high-potential side electrode layer (n-type GaAs layer 18) in accordance with a potential difference given between the electrode layers 12 and 18. Accordingly, without exerting any influence upon the photocurrent, the effect of reducing the dark current can be obtained, resulting in an improvement in the performance of the infrared detector.

Moreover, the size of the quantum dot 14 need not be one and a half times the size of the quantum dot 16, and for example, may be twice or two and a half times the size thereof. The larger the total supply amount of InAs when the quantum dots 14 are formed, the larger the quantum dots 14 can be grown.

Second Embodiment

Figure 6:
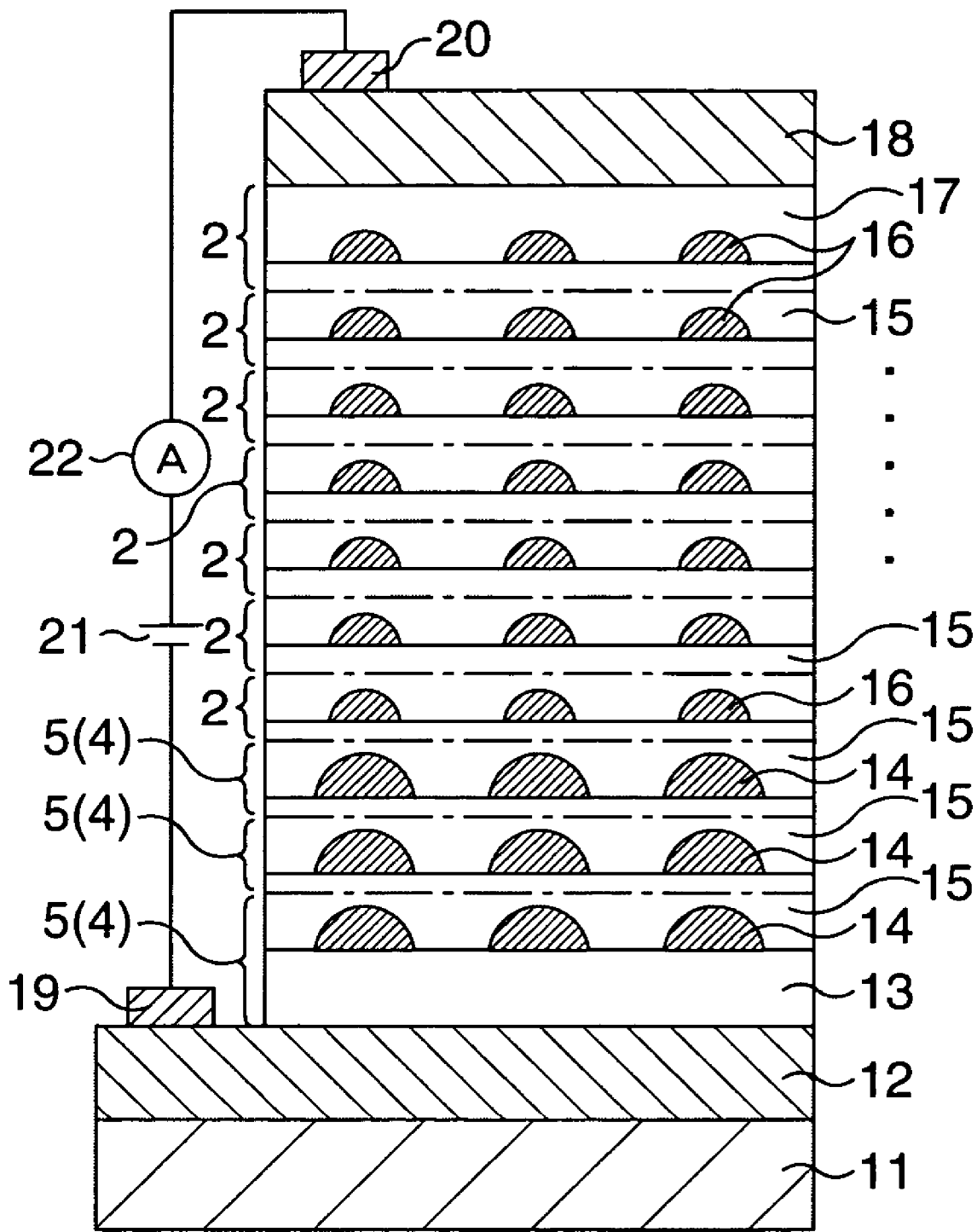
FIG. 6 is a sectional view showing a conceptual constitution of a QDIP according to a second embodiment of the present invention.

Next, a second embodiment of the present invention will be described. FIG. 6 is a sectional view showing a conceptual constitution of a QDIP according to the second embodiment of the present invention.

In the second embodiment, after the large quantum dots 14 are grown on the i-type GaAs layer 13 with the total supply amount of InAs set to 2.5 ML and the i-type GaAs layer 15 covering the quantum dots 14 is formed, the formation of other quantum dots 14 and the formation of another i-type GaAs layer 15 are repeated twice. As a result, the number of the quantum dot layers 5, that is, the dark current reducing layers 4 each including the large quantum dots 14 are three. The other constitution is the same as that of the first embodiment.

In such a second embodiment, rises of conduction-band edges of the quantum dots in the second and third dark current reducing layers 4 are added to a rise in the first layer. Therefore, the barrier to electrons becomes higher and the dark current is further reduced. Incidentally, the number of the dark current reducing layers 4 may be two, or four or more.

Third Embodiment

Figure 7:
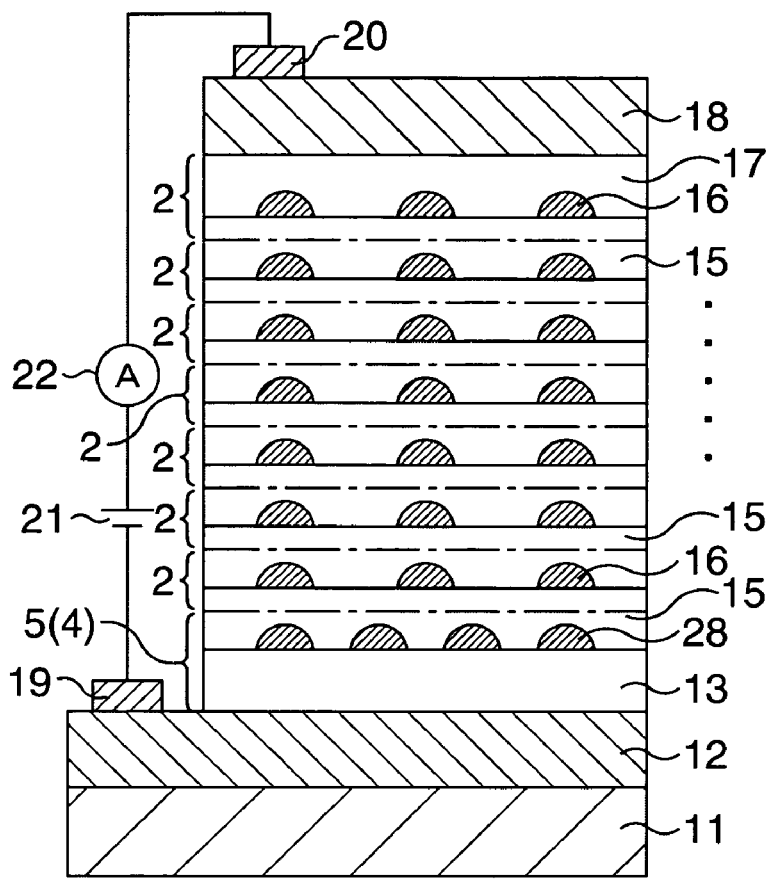
FIG. 7 is a sectional view showing a conceptual constitution of a QDIP according to a third embodiment of the present invention.

Next, a third embodiment of the present invention will be described. FIG. 7 is a sectional view showing a conceptual constitution of a QDIP according to the third embodiment of the present invention.

First, an n-type GaAs layer 12, for example, with a thickness of about 1000 nm (=1 μm) and a Si concentration of about $2 \times 10^{18}$ cm$^{-3}$ is grown as a bottom electrode layer on a semi-insulating GaAs substrate 11 at a substrate temperature of, for example, 600° C. by a molecular beam epitaxial method.

Then, an i-type GaAs layer 13 with a thickness of, for example, 50 nm is grown on the n-type GaAs layer 12. Incidentally, the substrate temperature is lowered from 600° C. to a temperature lower than in the first embodiment, for example, 480° C. while the i-type GaAs layer 13 is grown.

Subsequently, while the substrate temperature is maintained at 480° C., InAs is supplied such that the growth rate becomes, for example, 0.2 ML (monolayer)/s (second). In the present embodiment, the total supply amount of InAs is set to 2.0 ML. As a result, quantum dots 28 having about the same size as quantum dots 16 formed later are formed. However, since the growth temperature of the quantum dots 28 is lower than the growth temperature of the quantum dots 16, the movement of InAs reduces, and thereby a larger number of quantum dots 28 grow. Consequently, the numerical density of the quantum dots 28 becomes higher than the numerical density of the quantum dots 16 in the first embodiment. For example, the numerical density of the quantum dots 28 becomes about one and a half times the numerical density when the growth temperature is set to 500° C.

Thereafter, an i-type GaAs layer 15 with a thickness of, for example, 50 nm is grown. Note that the substrate temperature is raised from 480° C. to 500° C. while the i-type GaAs layer 15 is grown. The first-layer quantum dot layer 5 (dark current reducing layer 4 having a quantum well structure) is composed of the i-type GaAs layer 13, the quantum dots 28, and a part of the i-type GaAs layer 15 covering the quantum dots 28.

Then, while the substrate temperature is maintained at 500° C., the second-layer quantum dots 16 are formed by supplying InAs such that the growth rate becomes, for example, 0.2 ML/s. In the formation of the quantum dots 16, the total supply amount of InAs is set to about 2.0 ML.

Subsequently, the formation of the i-type GaAs layer 15 and the formation of the quantum dots 16 are repeated. The second and subsequent layer quantum dot layers 2 are each composed of the quantum dots 16, a part of the i-type GaAs layer 15 immediately below these quantum dots 16, and a part of the i-type GaAs layer 15 covering these quantum dots 16. For example, if the total number of quantum dot layers will be eight, the growth of the i-type GaAs layer 15 and the supply of InAs are later repeated six times.

Thereafter, an i-type GaAs layer 17 with a thickness of, for example, 50 nm is grown so as to cover the quantum dots 16 located uppermost. The quantum dot layer 2 located uppermost is composed of these quantum dots 16, a part of the i-type GaAs layer 15 immediately below these quantum dots 16, and the i-type GaAs layer 17. Incidentally, the substrate temperature is raised from 500° C. to 600° C. again while the i-type GaAs layer 17 is grown.

Then, while the substrate temperature is maintained at 600° C., the n-type GaAs layer 18, for example, with a thickness of about 1000 nm and a Si concentration of about $2 \times 10^{18}$ cm$^{-3}$ is grown as a top electrode layer.

Subsequently, by etching a part of the n-type GaAs layer 18, the i-type GaAs layer 17, and the i-type GaAs layers 15 and the i-type GaAs layer 13 including the quantum dots 16 or 28 with lithography technique and dry etching technique, a part of the surface of the n-type GaAs layer 12 is exposed. Thereafter, using a metal deposition method, electrodes 19 and 20 are formed on the n-type GaAs layer 18 (top electrode layer) and the n-type GaAs layer 12 (bottom electrode layer). The electrodes 19 and 20 are constituted, for example, by stacking a Ni film and a Au film on a AuGe film. Thus, the basic constitution of the QDIP according to the third embodiment is completed.

Figure 8:
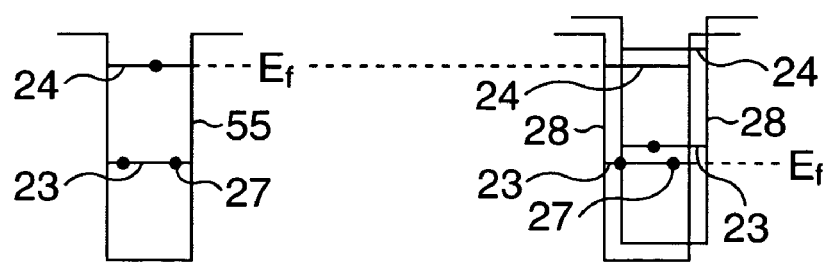
FIG. 8 is a diagram showing the relation between Fermi energy and a numerical density of quantum dots.

Now, dependence of Fermi energy on the numerical density of the quantum dot will be described. FIG. 8 is a diagram showing the relation between Fermi energy and a numerical density of quantum dots. The left side of FIG. 8 shows energy levels of the quantum dot 55 used in the conventional infrared detector, and the right side thereof shows energy levels of the quantum dot 28. The numerical density of the quantum dots 55 is about the same as that of the quantum dots 16 and lower than that of the quantum dots 28.

As both are compared, in either of the quantum dots 28 and 55, quantum levels are only the ground level 23 and the first excited level 24.

However, as the same number of electrons 27 are supplied from the electrode layer to the quantum dots 28 and 55, respectively, the number of electrons which occupy the levels of the quantum dots 28 is smaller compared with the low numerical density quantum dots 55 since the number of electrons supplied to each quantum dot is inversely proportional to the numerical density of quantum dots.

Namely, the total number of electrons supplied from the electrode layer to the first-layer quantum dot layer is almost fixed irrespective of a difference in the numerical density of quantum dots, and hence if the number density of the quantum dots 28 is twice the number density of the quantum dots 55, the number of electrons supplied to each of the quantum dots 28 becomes half the number of electrons supplied to each of the quantum dots 55.

For example, if three electrons are supplied to each quantum dot 55, the supplied electrons 27 occupy the quantum levels sequentially from the quantum level at which energy is the lowest, so that the first and second electrons 27 are disposed at the ground level 23, and the third electron 27 is disposed at the first excited level 24. As a result, the Fermi energy coincides with this first excited level 24.

On the other hand, if the same number of electrons are supplied to the quantum dots 28, one and a half electrons are supplied to each quantum dot 28, so that all the supplied electrons 27 occupy the ground level 23. As a result, the Fermi energy coincides with this first excited level 24.

As described above, the Fermi energy of the quantum dot layer 5 including the high numerical density quantum dots 28 is relatively lower compared with when the numerical density is low. Accordingly, in the entire system, as in the first embodiment, the potential barrier on the n-type GaAs layer 12 (bottom electrode layer) side rises, and thereby the dark current reduces.

Incidentally, the numerical density of the quantum dots 28 need not be one and a half times the numerical density of the quantum dots 16, and for example, may be twice or two and a half times the numerical density thereof. The lower the growth temperature when the quantum dots 28 are formed, the higher the numerical density of the quantum dots 28 can become.

Fourth Embodiment

Figure 9:
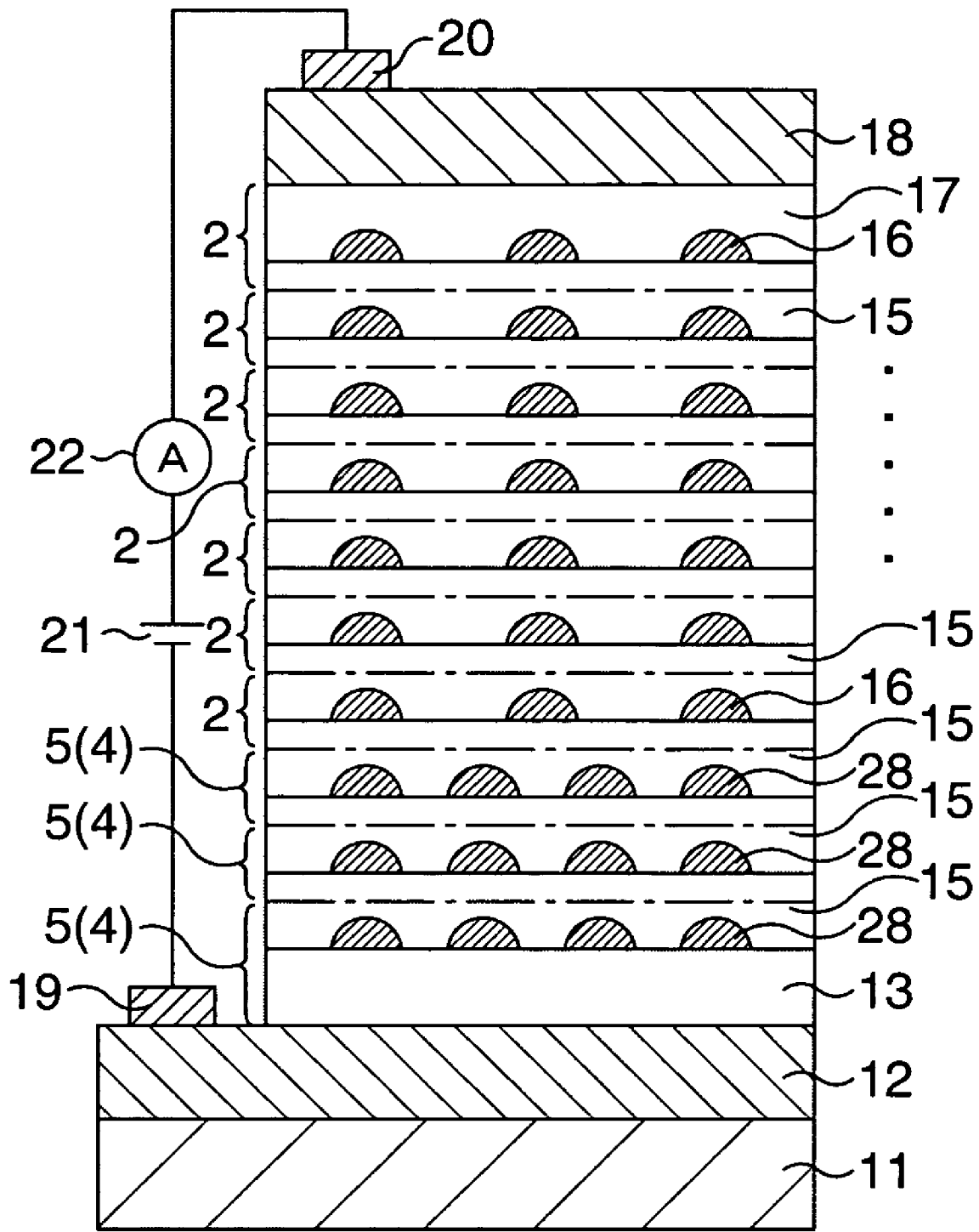
FIG. 9 is a sectional view showing a conceptual constitution of a QDIP according to a fourth embodiment of the present invention.

Next, a fourth embodiment of the present invention will be described. FIG. 9 is a sectional view showing a conceptual constitution of a QDIP according to the fourth embodiment of the present invention.

In the fourth embodiment, after the high numerical density quantum dots 28 are grown on the i-type GaAs layer 13 by supplying InAs with the substrate temperature set to 480° C. and the i-type GaAs layer 15 covering the quantum dots 28 is formed, the formation of other quantum dots 28 and the formation of another i-type GaAs layer 15 are repeated twice. As a result, the number of the quantum dot layers 5, that is, the dark current reducing layers 4 each including the high numerical density quantum dots 28 are three. The other constitution is the same as that of the third embodiment.

In such a fourth embodiment, rises of conduction-band edges in the second and third dark current reducing layers 4 are added to a rise in the first layer. Therefore, the barrier to electrons becomes higher and the dark current is further reduced. Incidentally, the number of the dark current reducing layers 4 may be two, or four or more.

Fifth Embodiment

Figure 10:
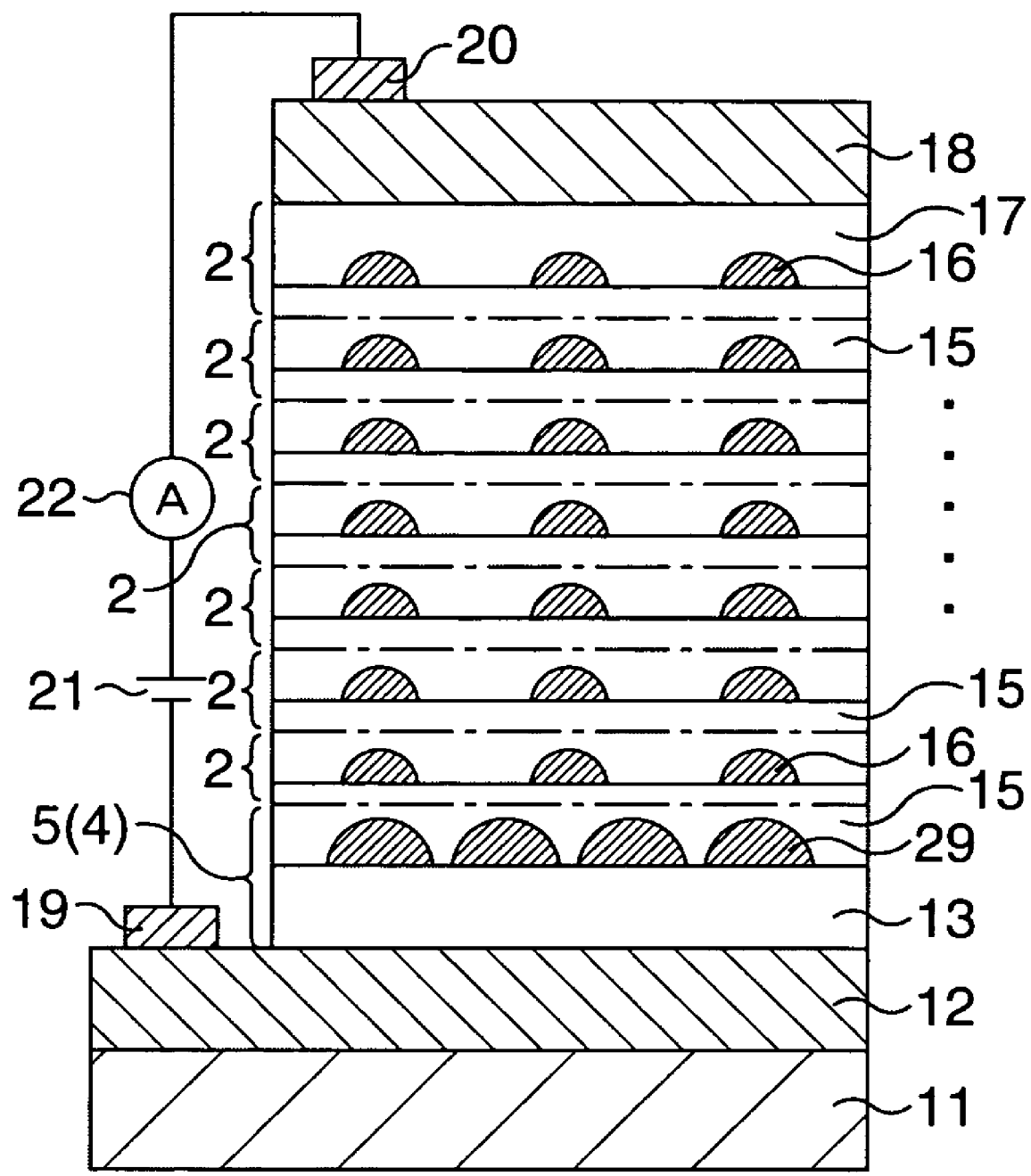
FIG. 10 is a sectional view showing a conceptual constitution of a QDIP according to a fifth embodiment of the present invention.

Next, a fifth embodiment of the present invention will be described. FIG. 10 is a sectional view showing a conceptual constitution of a QDIP according to the fifth embodiment of the present invention.

First, an n-type GaAs layer 12, for example, with a thickness of about 1000 nm (=1 μm) and a Si concentration of about $2 \times 10^{18}$ cm$^{-3}$ is grown as a bottom electrode layer on a semi-insulating GaAs substrate 11 at a substrate temperature of, for example, 600° C. by a molecular beam epitaxial method.

Then, an i-type GaAs layer 13 with a thickness of, for example, 50 nm is grown on the n-type GaAs layer 12. Incidentally, the substrate temperature is lowered from 600° C. to a temperature lower than in the first embodiment, for example, 480° C., while the i-type GaAs layer 13 is grown.

Subsequently, while the substrate temperature is maintained at 480° C., InAs is supplied such that the growth rate becomes, for example, 0.2 ML (monolayer)/s (second). In the present embodiment, as in the first embodiment, the total supply amount of InAs is set to 2.5 ML. As a result, quantum dots 29 having about the same size as the quantum dots 14 in the first embodiment are formed at about the same numerical density of the quantum dots 28 in the third embodiment.

Thereafter, an i-type GaAs layer 15 with a thickness of, for example, 50 nm is grown. Note that the substrate temperature is raised from 480° C. to 500° C. while the i-type GaAs layer 15 is grown.

Then, as in the first embodiment, a plurality of i-type GaAs layers 15, quantum dots 16, an i-type GaAs layer 17, and an n-type GaAs layer 18 are grown. Subsequently, by etching a part of the n-type GaAs layer 18, the i-type GaAs layer 17, and the i-type GaAs layers 15 and the i-type GaAs layer 13 including the quantum dots 16 or 29 with lithography technique and dry etching technique, a part of the surface of the n-type GaAs layer 12 is exposed. Thereafter, using a metal deposition method, electrodes 19 and 20 are formed on the n-type GaAs layer 18 (top electrode layer) and the n-type GaAs layer 12 (bottom electrode layer). The electrodes 19 and 20 are constituted, for example, by stacking a Ni film and a Au film on a AuGe film. Thus, the basic constitution of the QDIP according to the fifth embodiment is completed.

In such a fifth embodiment, the effect of the first embodiment and the effect of the third embodiment can be obtained. Namely, a synergistic effect between the effect of a reduction in the Fermi energy caused by the large-sized quantum dots 29 included in the quantum dot layer 5 which functions as the dark current reducing layer 4 having the quantum well structure and the effect of a coincidence of the Fermi energy with the ground level caused by the high numerical density quantum dots 29 can be obtained. Accordingly, the potential barrier to electrons can certainly be heightened.

Sixth Embodiment

Figure 11:
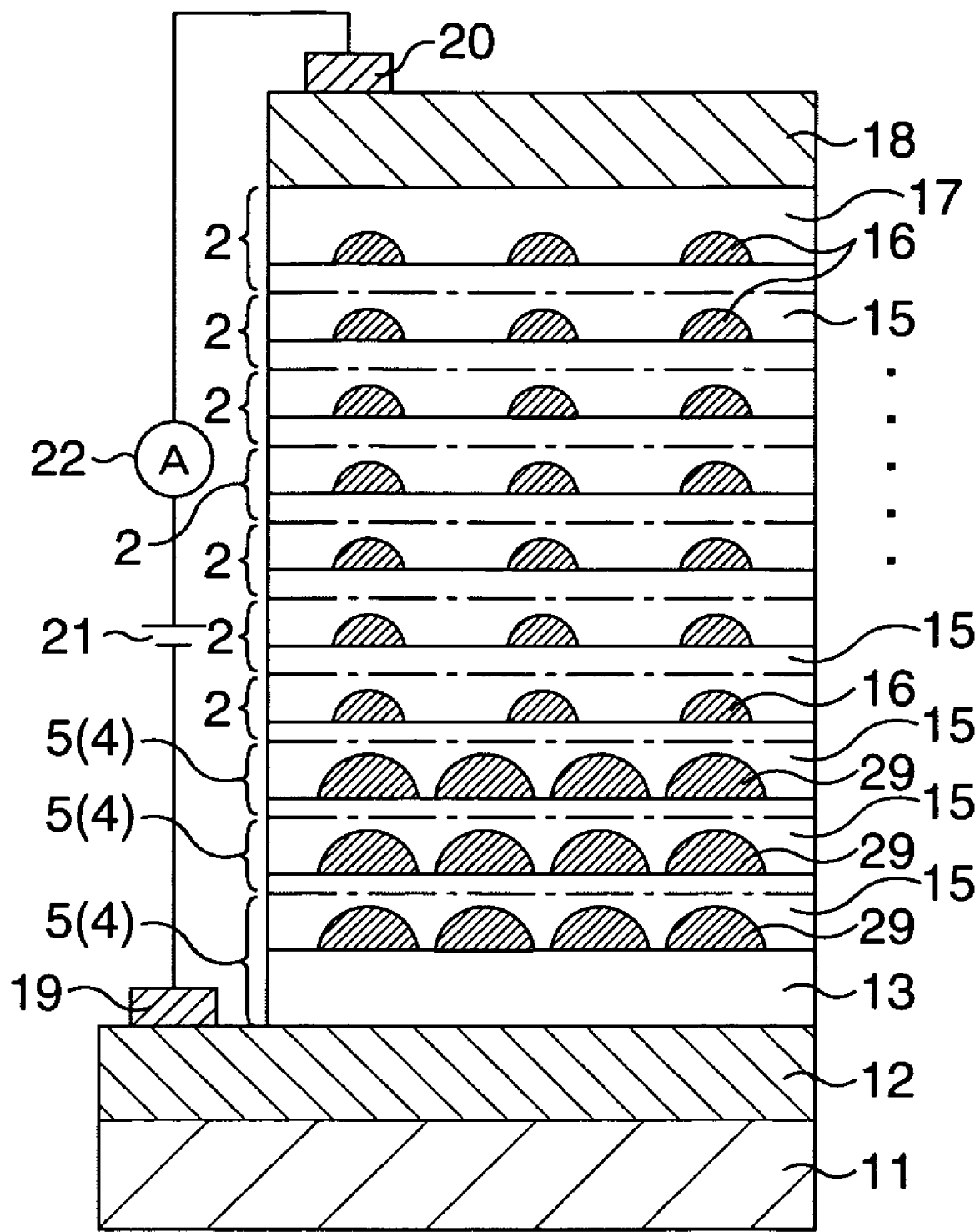
FIG. 11 is a sectional view showing a conceptual constitution of a QDIP according to a sixth embodiment of the present invention.

Next, a sixth embodiment of the present invention will be described. FIG. 11 is a sectional view showing a conceptual constitution of a QDIP according to the sixth embodiment of the present invention.

In the sixth embodiment, after the large-sized and high numerical density quantum dots 29 are grown on the i-type GaAs layer 13 with the substrate temperature set to 480° C. and the total supply amount of InAs set to 2.5 ML and the i-type GaAs layer 15 covering the quantum dots 29 is formed, the formation of other quantum dots 29 and the formation of another i-type GaAs layer 15 are repeated twice. As a result, the number of the quantum dot layers 5, that is, the dark current reducing layers 4 each including the high numerical density large quantum dots 29 becomes three. The other constitution is the same as that of the fifth embodiment.

In such a sixth embodiment, rises of conduction-band edges in the second and third dark current reducing layers 4 are added to a rise in the first layer. Therefore, the barrier to electrons becomes higher and the dark current is further reduced. Incidentally, the number of the dark current reducing layers 4 may be two, or four or more.

Seventh Embodiment

Figure 12:
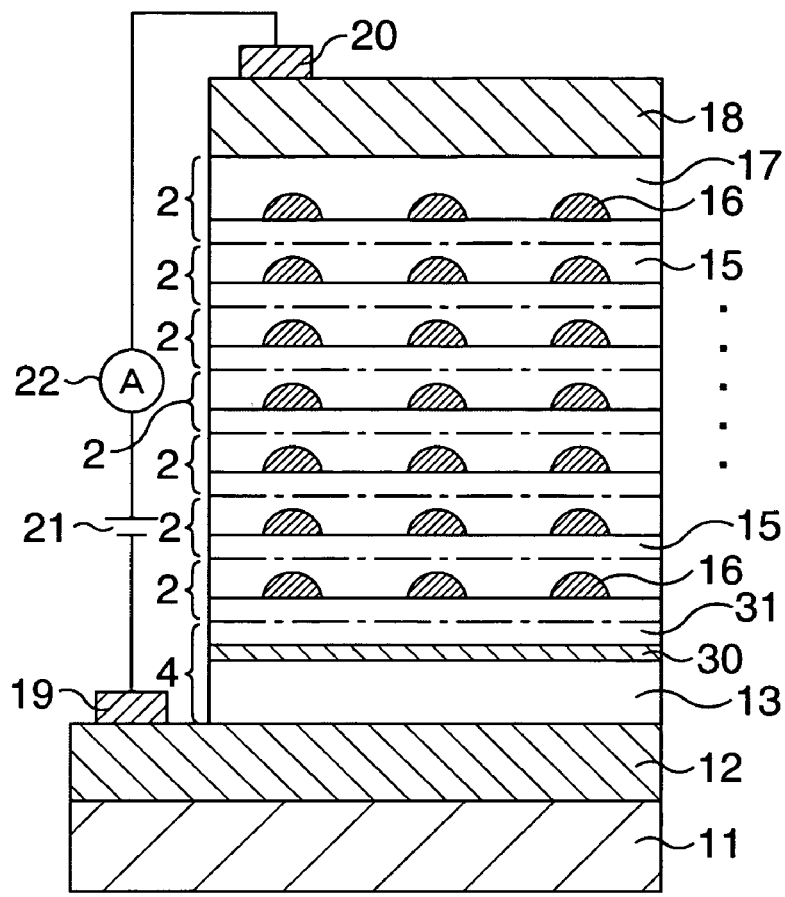
FIG. 12 is a sectional view showing a conceptual constitution of a QDIP according to a seventh embodiment of the present invention.

Next, a seventh embodiment of the present invention will be described. FIG. 12 is a sectional view showing a conceptual constitution of a QDIP according to the seventh embodiment of the present invention.

First, an n-type GaAs layer 12, for example, with a thickness of about 1000 nm (=1 μm) and a Si concentration of about $2 \times 10^{18}$ $cm^{-3}$ is grown as a bottom electrode layer on a semi-insulating GaAs substrate 11 at a substrate temperature of, for example, 600° C. by a molecular beam epitaxial method.

Then, an i-type GaAs layer 13 with a thickness of, for example, 50 nm and an i-type InGaAs layer 30 with an In (indium) composition ratio of, for example, 0.3 and a thickness of, for example, 5 nm are grown in sequence on the n-type GaAs layer 12 while the substrate temperature is maintained at 600° C.

At this time, a compressive strain is applied to the i-type InGaAs layer 30, but the i-type InGaAs layer 30 does not three-dimensionally grow since its In (indium) composition is sufficiently low.

Subsequently, an i-type GaAs layer 31 with a thickness of, for example, 50 nm is grown on the i-type InGaAs layer 30. Incidentally, the substrate temperature is lowered from 600° C. to a temperature suitable for the formation of quantum dots, for example, 500° C. while the i-type GaAs layer 31 is grown.

As a result, formed in the present embodiment is a one-dimensional quantum well structure in which the i-type GaAs layer 31 and the i-type GaAs layer 13 function as barrier layers, and the i-type InGaAs layer 30 functions as a one-dimensional quantum well layer. Thus, a dark current reducing layer 4 having a quantum well structure is composed of the i-type GaAs layer 13, the i-type InGaAs layer 30, and a part of the i-type GaAs layer 31.

Thereafter, as in the first embodiment, a plurality of i-type GaAs layers 15, quantum dots 16, an i-type GaAs layer 17, and a n-type GaAs layer 18 are grown. Then, by etching a part of the n-type GaAs layer 18, the i-type GaAs layer 17, the i-type GaAs layers 15 including the quantum dots 16, the i-type GaAs layer 31, the i-type InGaAs layer 30, and the i-type GaAs layer 13 with lithography technique and dry etching technique, a part of the surface of the n-type GaAs layer 12 is exposed. Subsequently, using a metal deposition method, electrodes 19 and 20 are formed on the n-type GaAs layer 18 (top electrode layer) and the n-type GaAs layer 12 (bottom electrode layer). The electrodes 19 and 20 are constituted, for example, by stacking a Ni film and a Au film on a AuGe film. Thus, the basic constitution of the QDIP according to the seventh embodiment is completed.

Figure 13:
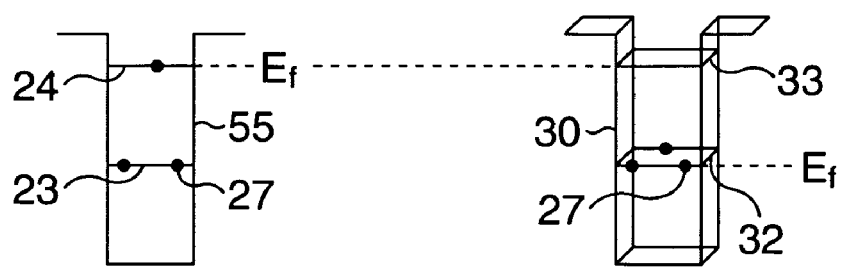
FIG. 13 is a diagram showing the relation between Fermi energy and a quantum structure.

Now, dependence of Fermi energy on quantum structure will be described. FIG. 13 is a diagram showing the relation between Fermi energy and a quantum structure. The left side of FIG. 13 shows energy levels of the quantum dot 55 used in the conventional infrared detector, and the right side thereof shows energy levels of the i-type InGaAs layer 30.

As both are compared, in the quantum dot 55, quantum levels are only the ground level 23 and the first excited level 24.

Also in the i-type InGaAs layer 30 (one-dimensional quantum well layer), quantum levels are only a ground level 32 and a first excited level 33, but the state number of the ground level 32 of the i-type InGaAs layer 30 is sufficiently larger than a product of the number of the quantum dots 55 included in the quantum dot layer and the state number of the ground level 23. Hence, as the same number of electrons are supplied from the electrode layer, electrons supplied to the i-type GaAs layer 30 mostly occupy the ground level 32 of the i-type InGaAs layer 30 although the electron 27 sometimes occupies the first excited level 24 in the quantum dot 55.

For example, if three electrons are supplied to each quantum dot 55, the electron 27 is disposed also at the first excited level 24. Consequently, the Fermi energy coincides with the first excited level 24.

On the other hand, in the i-type InGaAs layer 30, all of the supplied electrons 27 occupy the ground level 32, so that the Fermi energy almost coincides with the ground level 32. Therefore, the Fermi energy of the i-type InGaAs layer 30 is relatively lower compared with that of the quantum dot layer including the quantum dots 16. Accordingly, in the entire system, as in the first embodiment, the potential barrier on the n-type GaAs layer 12 (bottom electrode layer) side rises, and thereby the dark current reduces.

Eighth Embodiment

Figure 14:
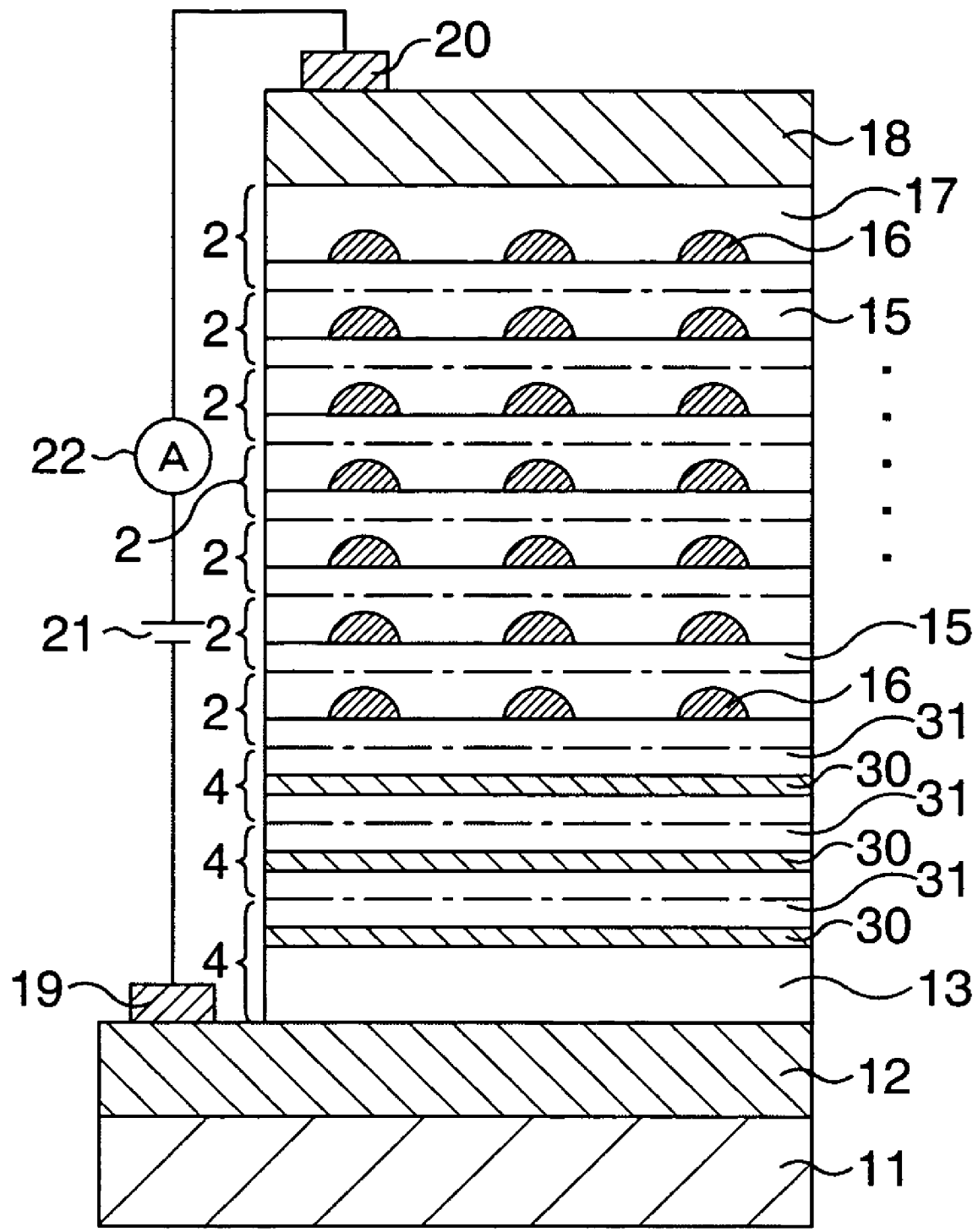
FIG. 14 is a sectional view showing a conceptual constitution of a QDIP according to an eighth embodiment of the present invention.

Next, an eighth embodiment of the present invention will be described. FIG. 14 is a sectional view showing a conceptual constitution of a QDIP according to the eighth embodiment of the present invention.

In the eighth embodiment, after the i-type InGaAs layer 30 and the i-type GaAs layer 31 are grown on the i-type GaAs layer 13 at a substrate temperature of 600° C., the formation of another i-type InGaAs layer 30 and the formation of another i-type GaAs layer 31 are repeated twice. As a result, the number of the one-dimensional quantum well layers, that is, the dark current reducing layers 4 are three. The other constitution is the same as that of the seventh embodiment.

In such an eighth embodiment, rises of conduction-band edges in the second and third dark current reducing layers 4 are added to a rise in the first layer. Therefore, the barrier to electrons becomes higher and the dark current is further reduced. Incidentally, the number of the dark current reducing layers 4 may be two, or four or more.

Ninth Embodiment

Figure 15:
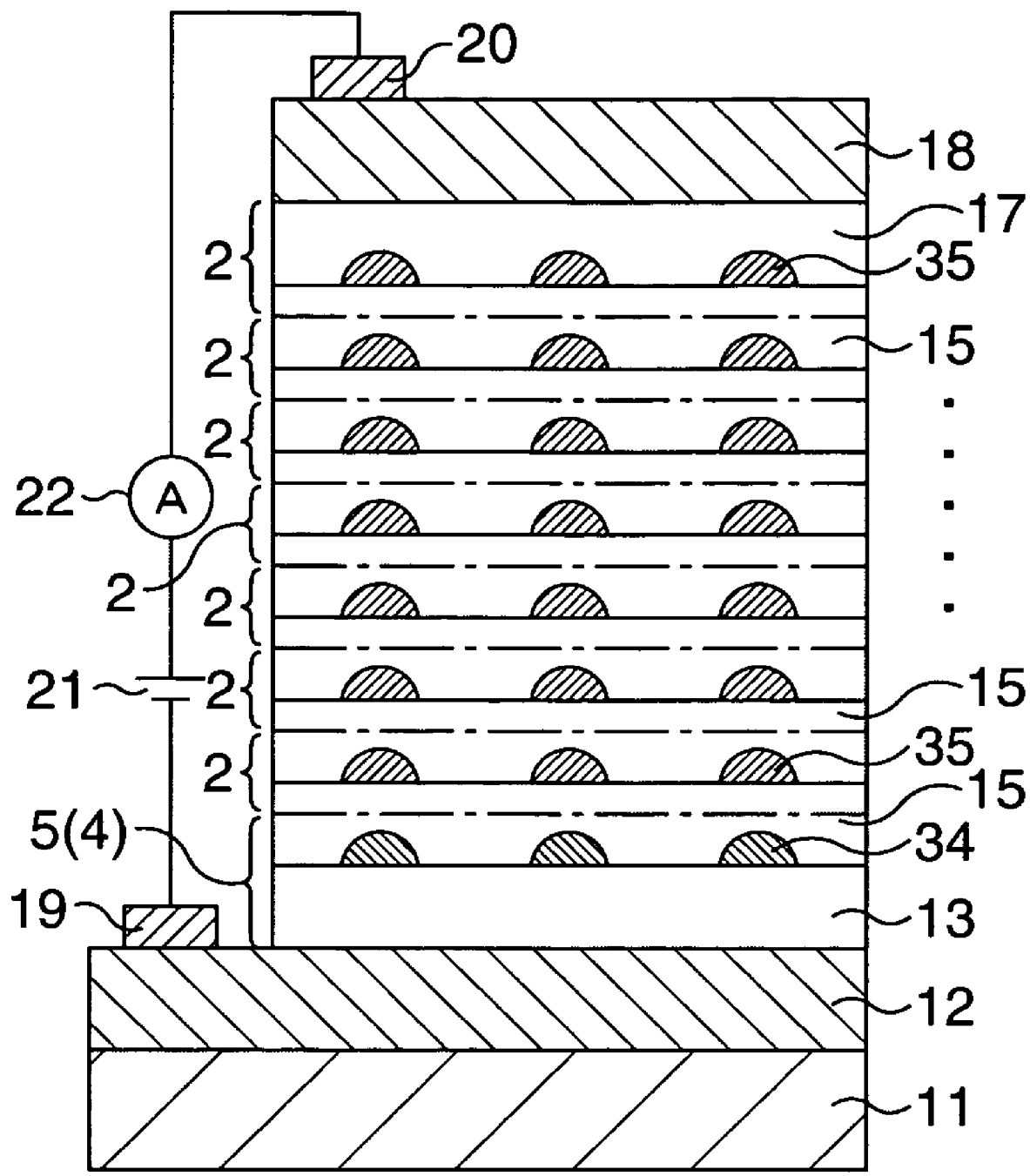
FIG. 15 is a sectional view showing a conceptual constitution of a QDIP according to a ninth embodiment of the present invention.

Next, a ninth embodiment of the present invention will be described. FIG. 15 is a sectional view showing a conceptual constitution of a QDIP according to the ninth embodiment of the present invention.

First, an n-type GaAs layer 12, for example, with a thickness of about 1000 nm (=1 µm) and a Si concentration of about $2 \times 10^{18}$ cm$^{-3}$ is grown as a bottom electrode layer on a semi-insulating GaAs substrate 11 at a substrate temperature of, for example, 600° C. by a molecular beam epitaxial method.

Then, an i-type GaAs layer 13 with a thickness of, for example, 50 nm is grown on the n-type GaAs layer 12. Incidentally, the substrate temperature is lowered from 600° C. to a temperature suitable for the formation of quantum dots, for example, 500° C. while the i-type GaAs layer 13 is grown.

Subsequently, while the substrate temperature is maintained at 500° C., quantum dots 34 are formed by supplying $In_xGa_{1-x}As$ such that the growth rate becomes, for example, 0.2 ML (monolayer)/s (second).

In forming the quantum dots 34, in this embodiment, the total supply amount of $In_xGa_{1-x}As$ is set to 2.0 ML. Moreover, an In (indium) composition ratio X of $In_xGa_{1-x}As$ to be supplied is set higher than an In (indium) composition ratio when the quantum dots 35 are formed later (for example, 0.5). For example, here, the In (indium) composition ratio is set to 1. As a result, the band gap of $In_xGa_{1-x}As$ composing the quantum dot 34 is smaller than that of the quantum dot 35 formed later, and the energy depth of the conduction-band side well portion of $In_xGa_{1-x}As$ composing the quantum dot 34 becomes deeper than that of the quantum dot 35. For example, the energy depth in the quantum dot 34 becomes about twice the energy depth when the In (indium) composition ratio is set to 0.5.

Thereafter, an i-type GaAs layer 15 with a thickness of, for example, 50 nm is grown on the i-type GaAs layer 13 so as to cover the quantum dots 34 while the substrate temperature is maintained at 500° C. The first-layer quantum dot layer 5 (dark current reducing layer 4 having a quantum well structure) is composed of the i-type GaAs layer 13, the quantum dots 34, and a part of the i-type GaAs layer 15 covering the quantum dots 34. Then, the second-layer quantum dots 35 are formed by supplying $In_xGa_{1-x}As$ such that the growth rate becomes, for example, 0.2 ML/s.

In the formation of the quantum dots 35, the In (indium) composition ratio X is set to 0.5, and the total supply amount of $In_xGa_{1-x}As$ is set to about 4.0 ML. The total supply amount of $In_xGa_{1-x}As$ is set to about twice the total supply amount when the quantum dots 34 are formed because the lower the In (indium) composition ratio, the larger the required total supply amount becomes, but not for the purpose of making the quantum dot 35 larger than the quantum dot 34.

As a result, the band gap of the quantum dot 35 becomes larger than that of the quantum dot 34.

Then, the formation of the i-type GaAs layer 15 and the formation of the quantum dots 35 are repeated. The second and subsequent layer quantum dot layers 2 are each composed of these quantum dots 35, a part of the i-type GaAs layer 15 immediately below these quantum dots 35, and a part of the i-type GaAs layer 15 covering these quantum dots 35. For example, if the total number of quantum dot layers will be eight, the growth of the i-type GaAs layer 15 and the supply of $In_xGa_{1-x}As$ are later repeated six times.

Subsequently, an i-type GaAs layer 17 with a thickness of, for example, 50 nm is grown so as to cover the quantum dots 35 located uppermost. The quantum dot layer 2 located uppermost is composed of these quantum dots 35, a part of the i-type GaAs layer 15 immediately below these quantum dots 35, and the i-type GaAs layer 17. Incidentally, the substrate temperature is raised from 500° C. to 600° C. again while the i-type GaAs layer 17 is grown.

Thereafter, while the substrate temperature is maintained at 600° C., an n-type GaAs layer 18, for example, with a thickness of about 1000 nm and a Si concentration of about $2 \times 10^{18}$ cm$^{-3}$ is grown as a top electrode layer.

Then, by etching a part of the n-type GaAs layer 18, the i-type GaAs layer 17, and the i-type GaAs layers 15 and the i-type GaAs layer 13 including the quantum dots 35 or 34 with lithography technique and dry etching technique, a part of the surface of the n-type GaAs layer 12 is exposed. Subsequently, using a metal deposition method, electrodes 19 and 20 are formed on the n-type GaAs layer 18 (top electrode layer) and the n-type GaAs layer 12 (bottom electrode layer). The electrodes 19 and 20 are constituted, for example, by stacking a Ni film and a Au film on a AuGe film. Thus, the basic constitution of the QDIP according to the ninth embodiment is completed.

Figure 16:
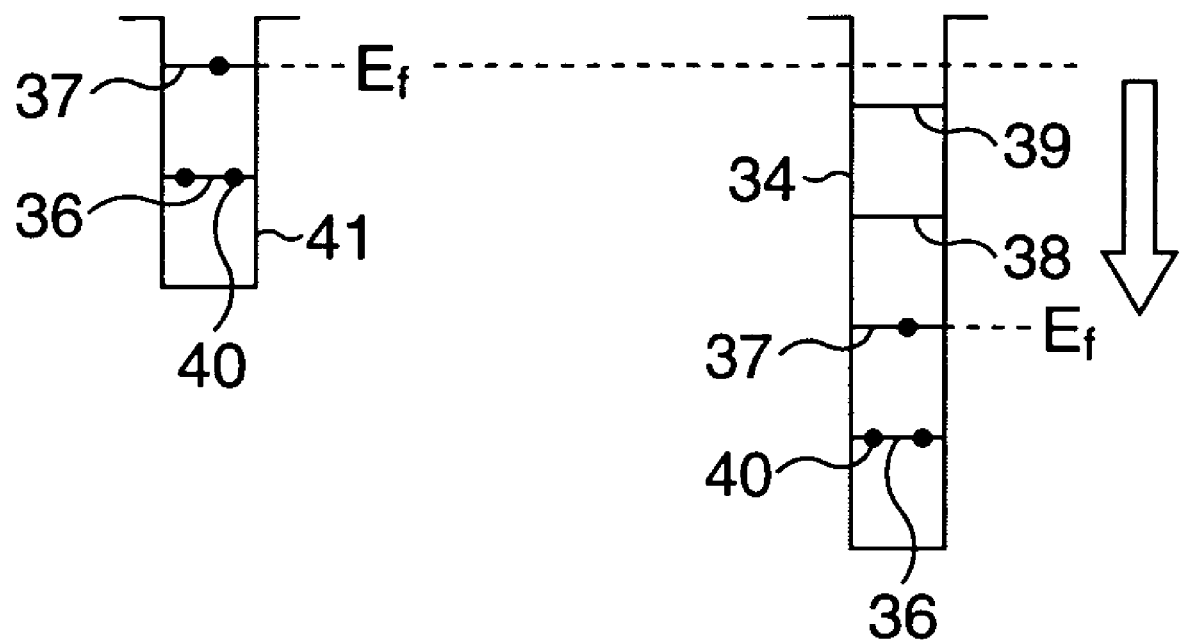
FIG. 16 is a diagram showing the relation between Fermi energy and a band gap of a well material composing quantum dots.

Now, dependence of Fermi energy on the band gap of a well material composing a quantum dot will be described. FIG. 16 is a diagram showing the relation between Fermi energy and the band gap of the well material composing the quantum dot.

The left side of FIG. 16 shows energy levels of a quantum dot 41 with a low In (indium) composition ratio, and the right side thereof shows energy levels of the quantum dot 34. The In (indium) composition ratio of the quantum dot 41 is about the same as that of the quantum dot 35 and lower than that of the quantum dot 34.

As both are compared, in the quantum dot 41, the band gap of the well material is larger, so that the conduction-band edge becomes higher, and quantum levels generated therein are only a ground level 36 and a first excited level 37.

In contrast, in the quantum dot 34, the conduction-band edge becomes lower and the well becomes deeper, so that many high excited levels 38 and 39 are generated, and thereby energy at the first excited level 37 becomes lower than that of the quantum dot 41. Therefore, as the same number of electrons 40 are supplied from the electrode layer to the quantum dots 34 and 41, respectively, the Fermi energy of the quantum dot 34 becomes relatively lower than the Fermi energy of the quantum dot 41.

For example, if three electrons are supplied to each quantum dot, the supplied electrons 40 occupy the quantum levels sequentially from the quantum level at which energy is the lowest, so that the first and second electrons 40 are disposed at the ground level 36, and the third electron 40 is disposed at the first excited level 37. As a result, the Fermi energy coincides with the first excited level 37.

In the entire system, as in the first embodiment, the potential barrier on the n-type GaAs layer 12 (bottom electrode layer) side rises, and thereby the dark current reduces.

Incidentally, the In (indium) composition ratio X of the quantum dot 34 need not be 1.0, and it may be, for example, 0.6, 0.7, 0.8, 0.9, or the like if the In (indium) composition ratio X of the quantum dot 35 is 0.5. The higher the In (indium) composition ratio X of the quantum dot 34, the deeper the energy depth of the well portion can be made.

Tenth Embodiment

Figure 17:
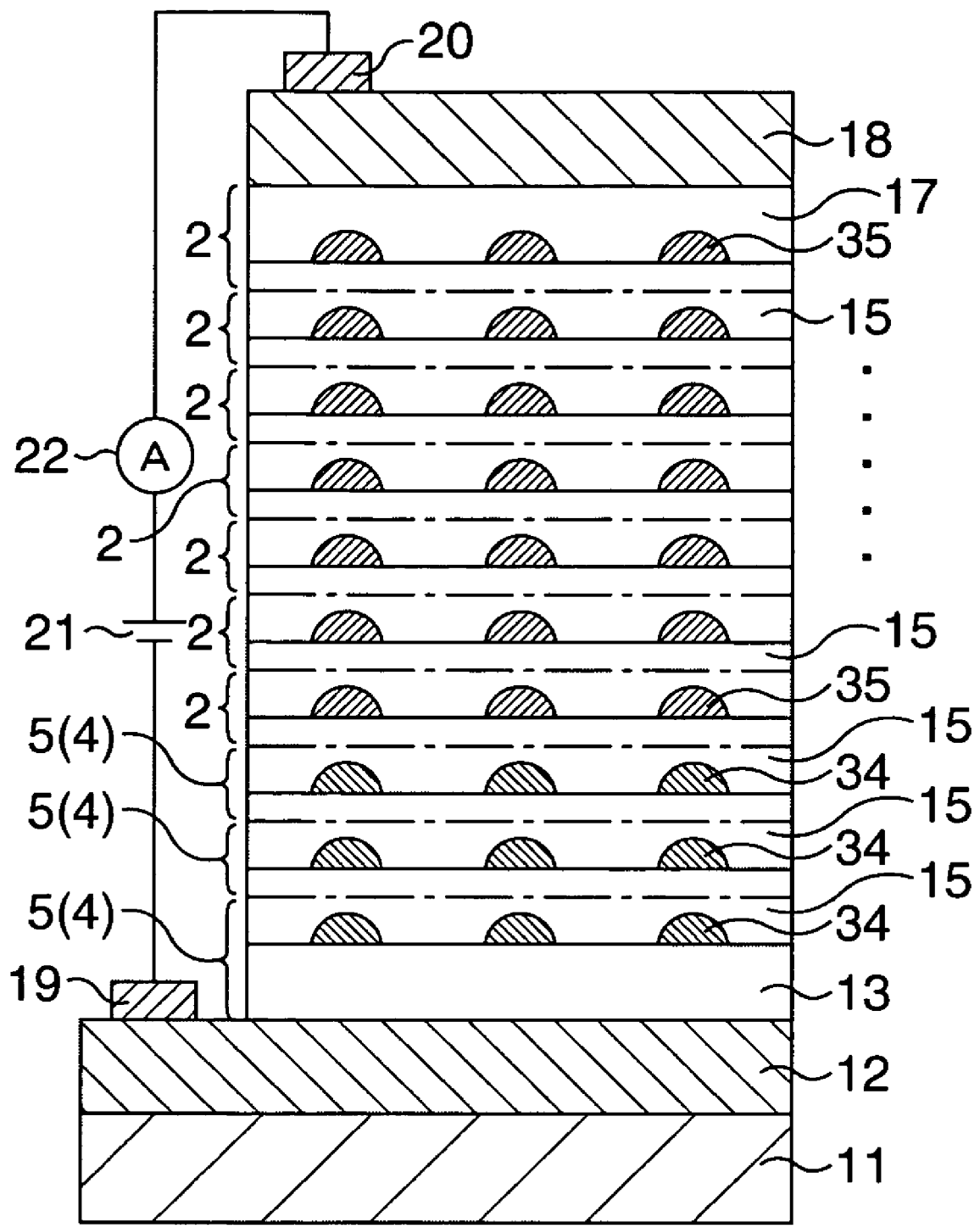
FIG. 17 is a sectional view showing a conceptual constitution of a QDIP according to a tenth embodiment of the present invention.
Figure 18:
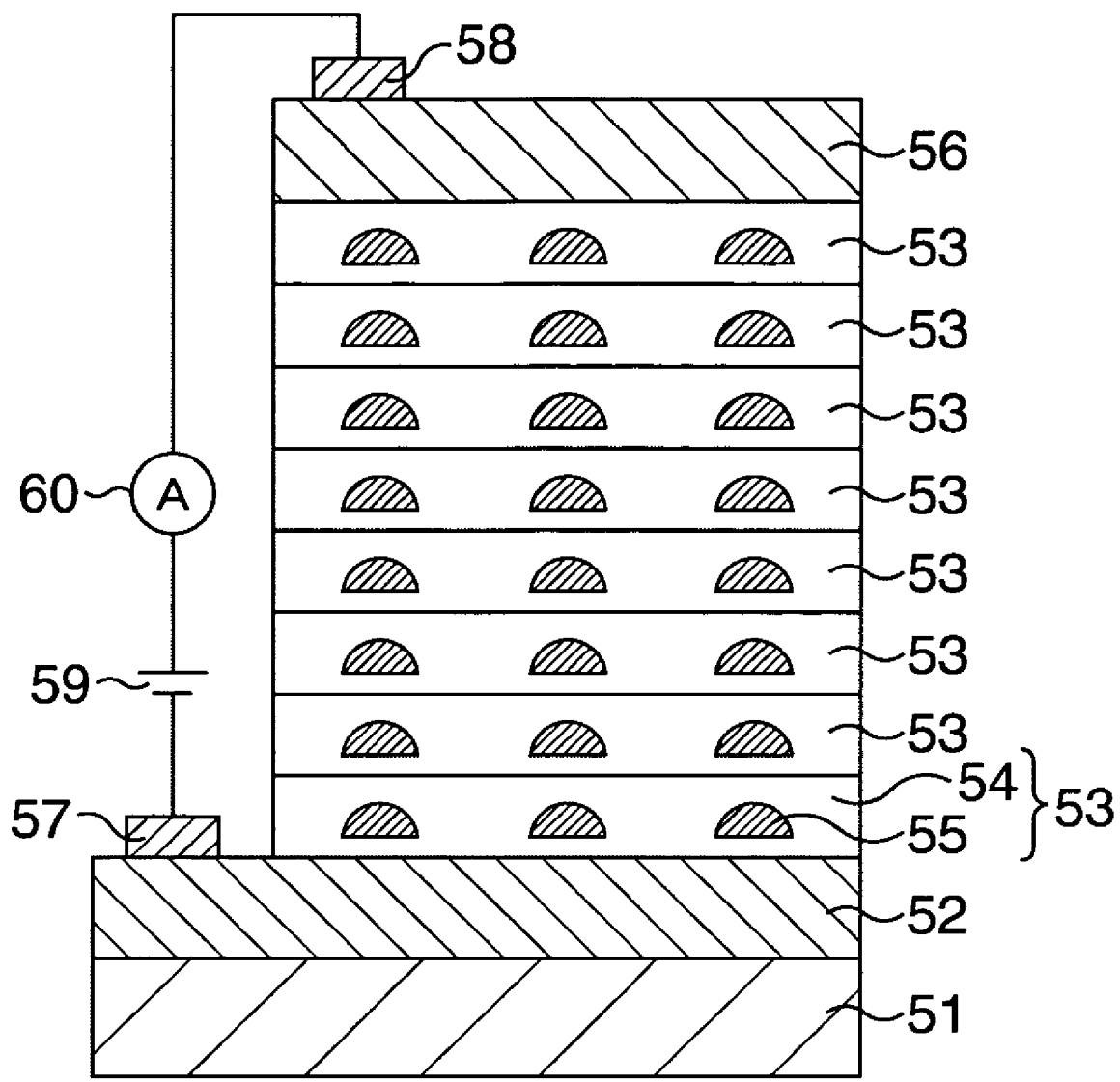
FIG. 18 is a conceptual sectional view of a conventional QDIP.
Figure 19:
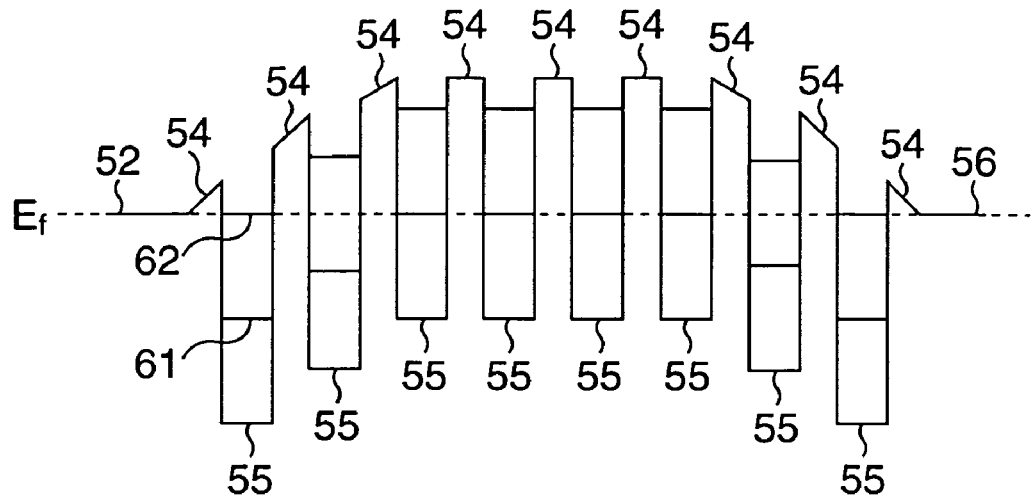
FIG. 19 is a diagram showing a conduction-band edge profile when no bias is applied to the QDIP shown in FIG. 18.

Next, a tenth embodiment of the present invention will be described. FIG. 17 is a sectional view showing a conceptual constitution of a QDIP according to the tenth embodiment of the present invention.

In the tenth embodiment, after the quantum dots 34 having an In (indium) composition ratio X of 1 are grown on the i-type GaAs layer 13 with the substrate temperature set to 500° C. and the total supply amount of $In_xGa_{1-x}As$ set to 2.0 ML and the i-type GaAs layer 15 covering these quantum dots 34 is formed, the formation of other quantum dots 34 and the formation of another i-type GaAs layer 15 are repeated twice. As a result, the number of the quantum dot layers 5, that is, the dark current reducing layers 4 each including the quantum dots 34 having the large In (indium) composition ratio X is three. The other constitution is the same as that of the ninth embodiment.

In such a tenth embodiment, rises of conduction-band edges in the second and third dark current reducing layers 4 are added to a rise in the first layer, so that the barrier to electrons becomes higher and the dark current is further reduced. Incidentally, the number of the dark current reducing layers 4 may be two, or four or more.

It is to be understood that the present invention is not limited to the constitutions, conditions, and so on described in these embodiments, and various changes may be made therein. For example, the composition of the quantum dot may be changed. For example, in the first to eighth embodiments, the quantum dot may be made of InGaAs containing a small amount of Ga (gallium).

Moreover, in these embodiments, the molecular beam epitaxial method is used as a growth method, but some other growth method such as a MOCVD method (metal organic chemical vapor deposition method) or an atomic layer epitaxial method (ALE method) may be used.

Further, in these embodiments, the number of the quantum dot layers 2 which effectively compose the infrared detecting section 1 is seven, but the number of quantum dot layers is arbitrary, and for example, may be appropriately selected within a range about from several layers to about 30 layers.

Furthermore, in these embodiments, the dark current reducing layer 4 is provided on the bottom electrode layer side, but if a bias is applied such that the top electrode layer becomes a low-potential side electrode layer, the dark current reducing layer 4 is preferably provided on the top electrode layer side.

Besides, in these embodiment, the dark current reducing layer 4 is provided only on the low-potential side electrode layer side, but additionally may be provided on the high-potential side electrode layer. In this case, use without concern for polarity becomes possible since symmetry in the electrical operation is obtained.

According to the present invention, a dark current reducing layer having a quantum well structure is provided, so that a potential barrier to electrons which become a dark current can be heightened without raising the growth temperature. Consequently, the performance of an infrared detector can be improved by only a dark current reducing effect without exerting any influence upon a photocurrent.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An infrared detector, comprising:
   an infrared detecting section which includes stacked quantum dot layers; and
   at least one dark current reducing layer which is provided at an end portion in a stacking direction of said infrared detecting section and has a quantum well structure.

2. The infrared detector according to claim 1, wherein each said quantum dot layer includes:
   a compound semiconductor layer, and
   quantum dots embedded in said compound semiconductor layer, a whole surface of said quantum dots being in contact with said semiconductor layer.

3. The infrared detector according to claim 2, wherein said dark current reducing layer includes quantum dots having a larger average size than said quantum dots included in said quantum dot layer.

4. The infrared detector according to claim 2, wherein said dark current reducing layer includes quantum dots having a higher numerical density than said quantum dots included in said quantum dot layer.

5. The infrared detector according to claim 2, wherein said dark current reducing layer includes quantum dots having a larger average size and a higher numerical density than said quantum dots included in said quantum dot layer.

6. The infrared detector according to claim 2, wherein said dark current reducing layer includes:
   a compound semiconductor layer with the same composition as said compound semiconductor layer; and
   quantum dots with the same composition as said quantum dots.

7. The infrared detector according to claim 2, wherein said dark current reducing layer includes a one-dimensional quantum well layer.

8. The infrared detector according to claim 7, wherein said dark current reducing layer includes two barrier layers which sandwich said one-dimensional quantum well layer therebetween.

9. The infrared detector according to claim 8, wherein a composition of said barrier layer is the same as a composition of said compound semiconductor layer.

10. The infrared detector according to claim 2, wherein said dark current reducing layer includes quantum dots whose material has a smaller band gap than said quantum dot as quantum wells.

11. The infrared detector according to claim 10, wherein quantum dots included in said quantum dot layer and quantum dots included in said dark current reducing layer are made of InGaAs.

12. The infrared detector according to claim 11, wherein an In composition of quantum dots included in said quantum dot layer is lower than an In composition of quantum dots included in said dark current reducing layer.

13. The infrared detector according to claim 1, wherein said dark current reducing layer includes a one-dimensional quantum well layer.

14. The infrared detector according to claim 1, wherein quantum dot included in said quantum dot layer and quantum dot included in said dark current reducing layer are made of InAs.

15. The infrared detector according to claim 1, wherein the number of said dark current reducing layers is one, two, or three.

* * * * *